United States Patent [19]
Araki et al.

[11] Patent Number: 5,973,719
[45] Date of Patent: Oct. 26, 1999

[54] LASER SCANNING UNIT HAVING AUTOMATIC POWER CONTROL FUNCTION

[75] Inventors: Yoshiyuki Araki; Takeshi Maruyama, both of Tokyo, Japan

[73] Assignee: Asahi Kogaku Kogyo Kabushiki Kaisha, Tokyo, Japan

[21] Appl. No.: 08/703,701

[22] Filed: Aug. 27, 1996

[30] Foreign Application Priority Data

Aug. 31, 1995 [JP] Japan .................................. 7-246694

[51] Int. Cl.⁶ ............................................. G03G 5/02
[52] U.S. Cl. ...................... 347/253; 347/247; 347/251; 347/240; 347/131; 358/298
[58] Field of Search ............................ 347/247, 251, 347/253, 240, 131; 358/298

[56] References Cited

U.S. PATENT DOCUMENTS

| | | |
|---|---|---|
| 4,679,057 | 7/1987 | Hamada . |
| 4,806,946 | 2/1989 | Ohnishi . |
| 4,849,980 | 7/1989 | Shoji et al. . |
| 4,876,556 | 10/1989 | Ohara ........................................ 358/298 |
| 4,879,459 | 11/1989 | Negishi . |
| 4,894,524 | 1/1990 | Murase et al. ........................... 347/247 |
| 4,907,236 | 3/1990 | Shimada . |
| 5,325,122 | 6/1994 | Hattori et al. ........................... 347/131 |
| 5,408,483 | 4/1995 | Kasai et al. . |
| 5,473,153 | 12/1995 | Araki et al. . |

FOREIGN PATENT DOCUMENTS

| | | |
|---|---|---|
| 61-124921 | 6/1986 | Japan . |
| 63-175573 | 7/1988 | Japan . |
| 214163 | 1/1990 | Japan . |

Primary Examiner—N. Le
Assistant Examiner—Hai C. Pham
Attorney, Agent, or Firm—Greenblum & Bernstein, P.L.C.

[57] ABSTRACT

Disclosed is a laser scanning unit for emitting a laser beam which scans on a surface to be scanned within a predetermined scanning range. The laser scanning unit has a laser diode, and a laser diode controller for controlling the laser diode to emit the laser beam. The laser beam has an intensity corresponding to one of a predetermined graduation steps within a intensity range defined by a first intensity and a second intensity greater than the first intensity in accordance with an image data. The laser scanning unit is further provided with a controller which is capable of shifting the intensity range by changing the first and second intensities.

17 Claims, 8 Drawing Sheets

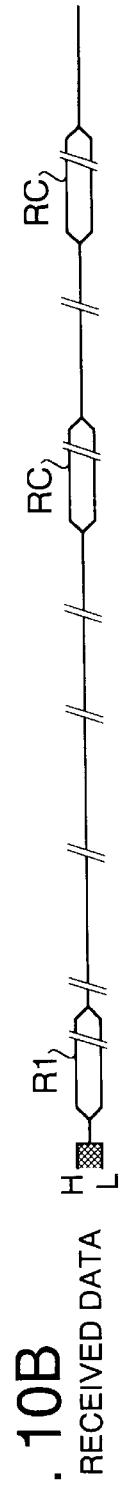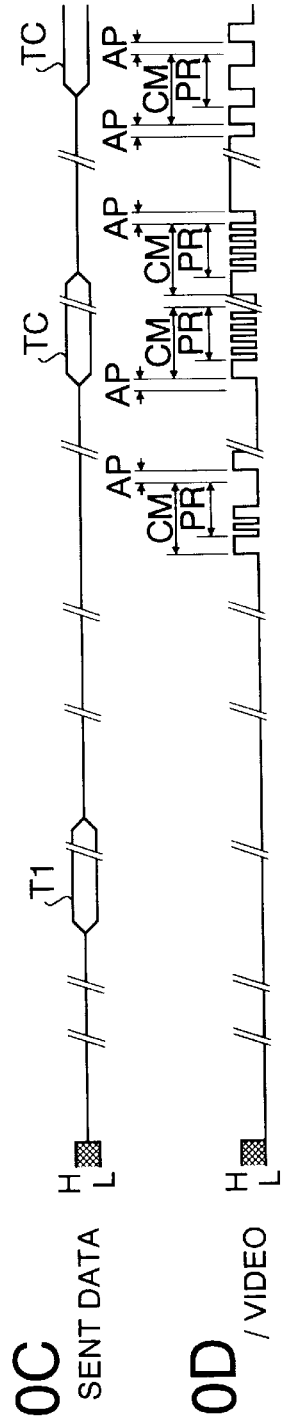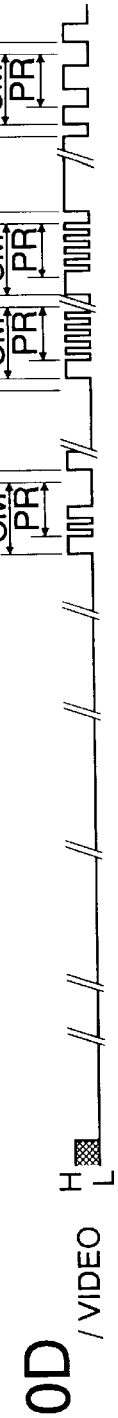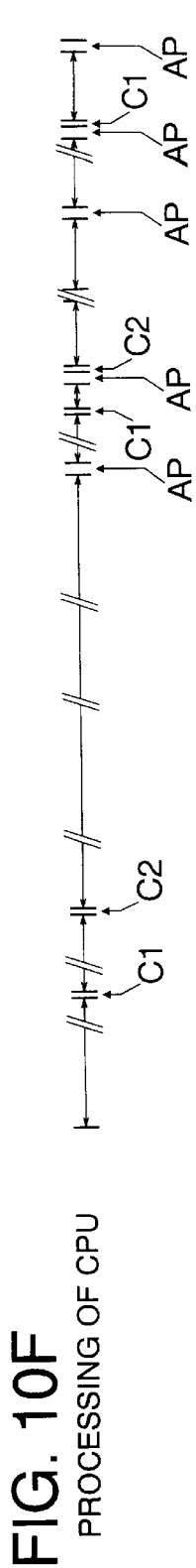

LASER SCANNING UNIT HAVING AUTOMATIC POWER CONTROL FUNCTION

BACKGROUND OF THE INVENTION

The present invention relates to a laser scanning unit which has an automatic power control function for stabilizing the intensity of an emitted laser beam.

Laser beam printers are well known and widely used as printers employing an electrophotographic imaging method. The laser printer employs a laser scanning unit for emitting a modulated laser beam which scans a surface to be scanned. Specifically, the laser scanning unit has a laser diode which is controlled to emit modulated laser beam. The laser beam is modulated on a dot basis (pixel basis) and the modulated laser beam scans a photoconductive surface in a predetermined direction. While the photoconductive surface is scanned by the modulated laser beam, the photoconductive surface is moved in a direction different from a scanning direction (e.g., in a direction perpendicular to the scanning direction). As a result, a certain area is exposed to the modulated laser beam and a two-dimensional latent image is formed on the photoconductive surface.

Recently a highly qualified image is demanded, and the printer is required to form not only a black and white image but a gradation image.

In order to vary a density of the image for froming the gradation image, energy to be applied for each pixel to the photoconductive surface is to be changed in accordance with the gradation level. Generally, there are two methods for producing the gradation image with the laser beam printer. One of the methods, which is generally used, is a method of varying the duration of time during which the laser beam is emitted (the laser diode is turned ON) without changing the intensity of the beam emitted by the laser diode. Usually, a pulse signal is applied to the laser diode to control the laser diode to emit the laser beam. The width of a pulse carried by the pulse signal corresponds to the duration of time during which the laser diode is turned ON. In this method, the pulse width is changed in accordance with a gradation level.

The other method is to vary the intensity of the emitted laser beam according to the density of the each pixel of the image without changing the width of the pulse. Recently, laser printers which are capable of performing a printing operation at a high speed are demanded. For the high speed printer, it is preferable to make the pulse width as short as possible. Therefore, in the latter method, the pulse width is fixed and the intensity of the laser beam emitted by the laser diode is varied in accordance with the image to be printed.

FIG. 5 shows an example of an Intensity-Current characteristic (referred to as an I-C characteristic) of a laser diode LD. The graph shows the intensity of the laser beam output by the laser diode, and an electrical current available through the laser diode. In this example, it is assumed that when the intensity of the laser beam is smaller, the density of the produced image is lower, and that when the intensity of the laser beam is greater, the density of the produced image is higher.

In the graph shown in FIG. 5, the intensity of the laser beam corresponding to a white image is indicated as Pw, and the intensity of the laser beam corresponding to a black image is indicated as Pb. The range of the intensity of the laser beam defined by the intensities Pw and Pb is divided into a predetermined number of gradations (e.g., 256), and according to the image data, the laser diode is controlled to emit a laser beam having one of the above intensities for each pixel. Specifically, in order to control the laser diode to emit the laser beam having the intensity corresponding to the density of the image to be produced, the quantity of the electrical current available in the laser diode is controlled in accordance with the image data.

However, the I-C characteristic varies depending on the ambient temperature. That is, if the temperature changes, the intensity of the laser beam with respect to the electrical current available through the laser diode varies, and therefore, an entire image may not have a stable (constant) density. The I-C characteristic changes such that the inclinations of the characteristic lines do not change but the line shifts in a right- or left-hand direction in FIG. 5, an example being shown by broken lines.

Further, the characteristic has a threshold current value Ith. If the electrical current available through the laser diode is greater than the threshold current value Ith, the laser diode performs stably. That is, the performance of the laser diode is guaranteed, and the intensity of the laser diode is substantially proportional to the electrical current flowing through the laser diode. However, if the electrical current available through the laser diode is less than the threshold value Ith, the performance of the laser diode is unstable, and the intensity of the laser beam may not correspond to the flowing current.

Furthermore, the threshold value Ith varies depending on the temperature, as mentioned above (indicated Ith' as an example in FIG. 5). In order to obtain a gradation image, the intensity of the laser beam should be strictly controlled, and therefore the above-described variation of the I-C characteristic should be taken into account when the laser diode is driven. In other words, the intensity of the laser beam when a white image is drawn should be maintained as Pw, and in order to obtain the gradation image, the difference between the intensity Pb for a black image and the intensity Pw for the white image should be maintained to have a predetermined difference.

Still further, even if the intensity of the laser beam is adjusted so as to correspond to the desired gradation, if the sensitivity of the photoconductive surface changes, the image having the desired gradation cannot be obtained. The sensitivity of the photoconductive drum may change due to a change of the ambient temperature, deterioration of the photoconductive material covering the peripheral surface of the drum, exchange of the photoconductive drum, and the like. Further, even if the characteristic of the photoconductive is unchanged, when the photoconductive drum is exposed to light of various color components, the intensity of the beam may be changed for respective color components.

SUMMARY OF THE INVENTION

It is therefore an object of the invention to provide an improved laser scanning unit which is capable of emitting a laser beam to form a desired gradation image regardless of the change of the sensitivity of the surface to be scanned.

For the object, according to the invention, there is provided a laser scanning unit, employed in an imaging apparatus, for scanning a predetermined scanning area of a surface to be scanned with a laser beam, comprising:

a laser diode for emitting the laser beam;

a driver for driving the laser diode to emit the laser beam which has an intensity corresponding to one of a plurality of predetermined gradation steps within an intensity range defined by a first intensity and a second intensity that is greater than the first intensity, in accordance with an image data; and a controller for shifting the intensity range.

Optionally, the controller shifts the intensity range in accordance with the sensitivity of the surface to be scanned. Therefore, an accurate gradation image can be formed regardless of the change of the sensitivity.

Further, the imaging apparatus and the controller are capable of communicating with each other, and wherein data related to the sensitivity of the surface to be scanned is transmitted from the imaging apparatus to the controller.

Further optionally, if the image data represents a zero value, the laser diode controller controls the laser diode not to emit the laser beam. Therefore, a so-called fog phenomenon can be avoided, especially when the surface to be scanned is a photoconductive surface.

According to another aspect of the invention, there is provided a laser scanning unit, employed in an imaging apparatus, for scanning a predetermined scanning area of a surface to be scanned with a laser beam, comprising:

a laser diode for emitting the laser beam;

a driver for driving the laser diode to emit the laser beam which has an intensity corresponding to one of a plurality of predetermined gradation steps within a intensity range defined by an first intensity and a second intensity that is greater than the first intensity, in accordance with an image data;

a first adjusting system for being actuated to adjust the first intensity to become a first predetermined intensity;

a second adjusting system for being actuated to adjust the second intensity to become a second predetermined intensity; and a controller for shifting at least one of the first predetermined intensity and the second predetermined intensity.

Optionally, the controller is capable of independently changing each of the first predetermined intensity and the second predetermined intensity. Therefore, the intensity range can be shifted, and further the range can be widened or narrowed.

Further optionally, the controller shifts at least one of the first predetermined intensity and the second predetermined intensity in accordance with the sensitivity of the surface to be scanned.

Still optionally, the first adjusting system comprises:

a detector for detecting the intensity of the laser beam; and a comparator for comparing the intensity of the laser beam with a first predetermined intensity, wherein the intensity of the laser beam is changed in accordance with a comparison result of the comparator.

Similarly, a second adjusting system comprises:

a detector for detecting an intensity of a laser beam; and a comparator for comparing the intensity of the laser beam with a second predetermined intensity, wherein the intensity of the laser beam is changed in accordance with a comparison result of the comparator.

Further optionally, the first and second adjusting systems are actuated when the laser beam does not scan the predetermined scanning area of the surface to be scanned.

Still optionally, only one of the first adjusting system and the second adjusting system is actuated at each scanning operation. In this case, the first adjusting system and the second adjusting system may be alternately actuated for successive scanning operations.

Alternatively, the first and second adjusting system are successively actuated during each scanning operation.

Optionally, if the image data represents a zero value, the laser diode controller controls the laser diode not to emit the laser beam.

Furthermore, when the second adjusting system is actuated, the first adjusting system is also actuated.

BRIEF DESCRIPTION OF THE ACCOMPANYING DRAWINGS

FIGS. 10A through 10F show a timing chart illustrating data communication between a main CPU of the laser beam printer and a CPU of the laser scanning unit.

DESCRIPTION OF THE EMBODIMENTS

Figure 1:
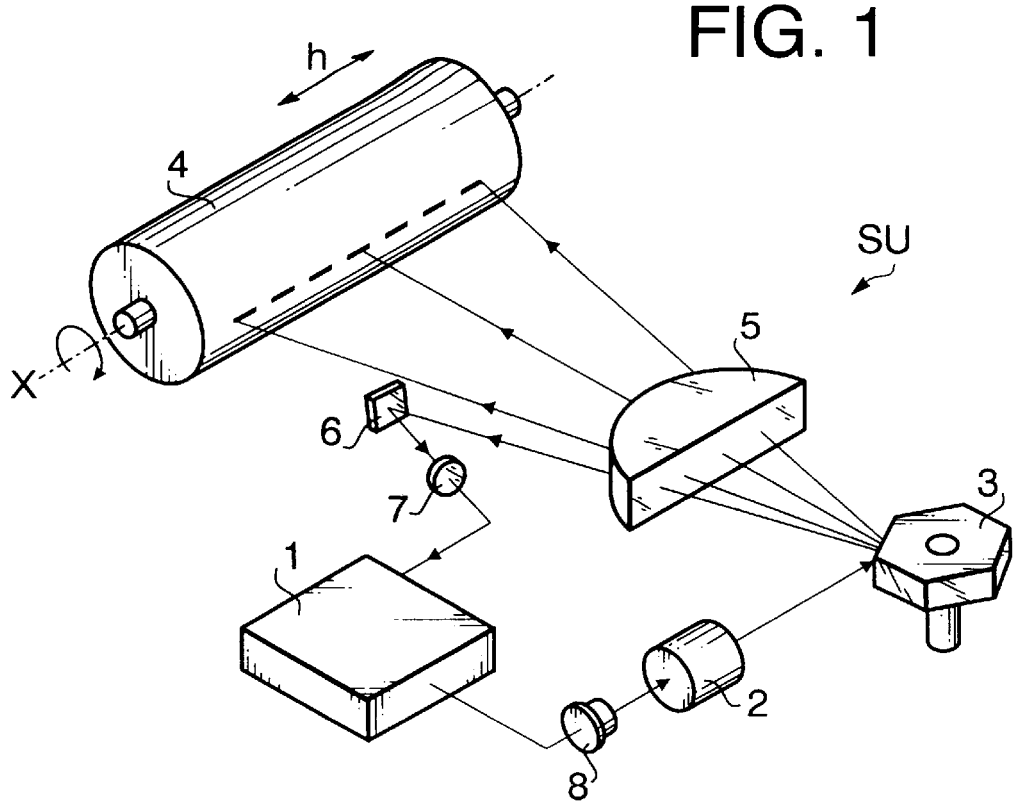
FIG. 1 is a schematic perspective view of elements included in a laser scanning unit as an embodiment of the present invention.

FIG. 1 is a schematic perspective view of elements included in a laser scanning unit SU as an embodiment of the present invention. According to the embodiment, the laser scanning unit is employed in a laser beam printer, and a photoconductive drum 4 of the laser beam printer is also shown in FIG. 1.

When image data is transmitted from an image memory (not shown) to an intensity modulating circuit 1, the intensity modulating circuit 1 flows an electrical current through a laser diode 8 in accordance with the image data. Specifically, the intensity modulating circuit 1 outputs a pulse signal, each pulse (i.e., the height of each pulse) corresponding to each pixel of the image, and amplitude modulated in accordance with a gradation information contained in the image data.

The laser beam emitted by the laser diode 8 passes through a collimator lens 2 which is arranged to receive the laser beam emitted by the laser diode 1 and outputs a parallel beam. The laser beam output from the collimator lens 2 is directed to a polygonal mirror 3. The polygonal mirror 3 rotates and deflects the laser beam in a direction perpendicular to the rotational axis of the polygonal mirror 3 as the laser beam is reflected on the mirror surfaces formed on the outer periphery of the polygonal mirror 3. The laser beam reflected by the mirror surfaces of the polygonal mirror 3 passes through an fθ lens 5 and scans a predetermined scanning area of the surface of the photoconductive drum 4 in the direction indicated by arrow h (the scanning in this direction is referred to as a main scanning hereinafter). The photoconductive drum is rotatable about a rotational axis X. The main scanning direction is parallel to the axis X. While the main scanning is executed, the photoconductive drum is rotated. Thus, the surface of the photoconductive drum is exposed to the modulated laser beam and the latent image is formed. The latent image will be developed to a toner image, and the toner image will be transferred onto a recording medium.

In the laser scanning unit SU, a mirror 6 is provided for reflecting a laser beam which passed through the fθ lens 5 but directed to an out of a predetermined scanning area and does not contribute to forming of the latent image. The laser beam reflected by the mirror 6 is directed to a light receiving sensor 7 which outputs a predetermined signal indicative of the reception of the laser beam reflected by the mirror 6. Based on the output signal of the light receiving sensor 7, a horizontal synchronous signal HSYNC is generated.

Figure 2:
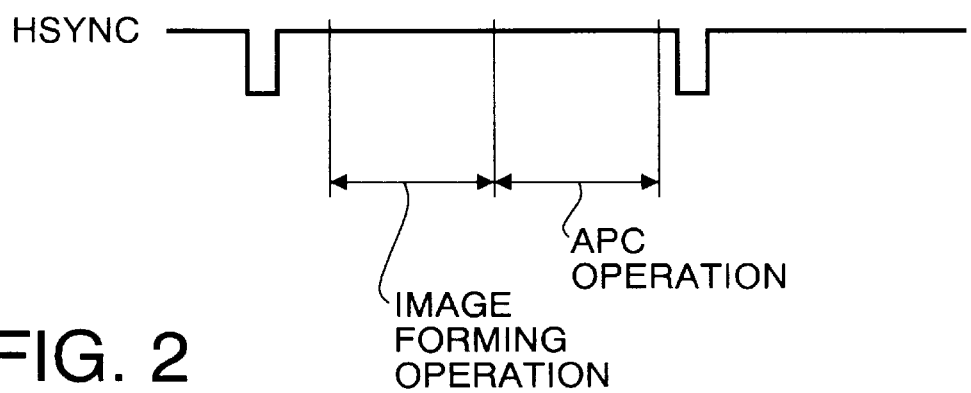
FIG. 2 is a timing chart showing an imaging duration and a duration for APC within one horizontal scanning period (i.e., between two successive horizontal synchronous signals)

FIG. 2 is a timing chart showing an imaging duration and a duration for APC (Automatic Power Control) within one horizontal scanning period (i.e., between two successive horizontal synchronous signals). In the embodiment, within a period of time corresponding to one scan of the laser beam, substantially a first half is used for forming the latent image, and a second half is used for performing the automatic power controlling operation for adjusting the intensity of the laser beam emitted by the laser diode 8. In other words, one scanning operation includes one image forming operation and one APC operation. Note that the APC is performed at every scanning. During the APC operation, the current levels to be flown in the laser diode is adjusted so that intensities of the laser beam have the lowest density and the highest density, respectively.

The former current level will hereinafter be referred to as a white level. The white level is a level of current which does not cause an attraction of the developing particle, such as the toner, onto the portion of the photoconductive surface which is exposed to the laser beam corresponding to the white level. The latter current level will be referred to as a black level hereinafter. The black level is a level of the electrical current which causes the toner to be attracted on the photoconductive surface exposed to the laser beam, in a saturated condition.

Figure 3:
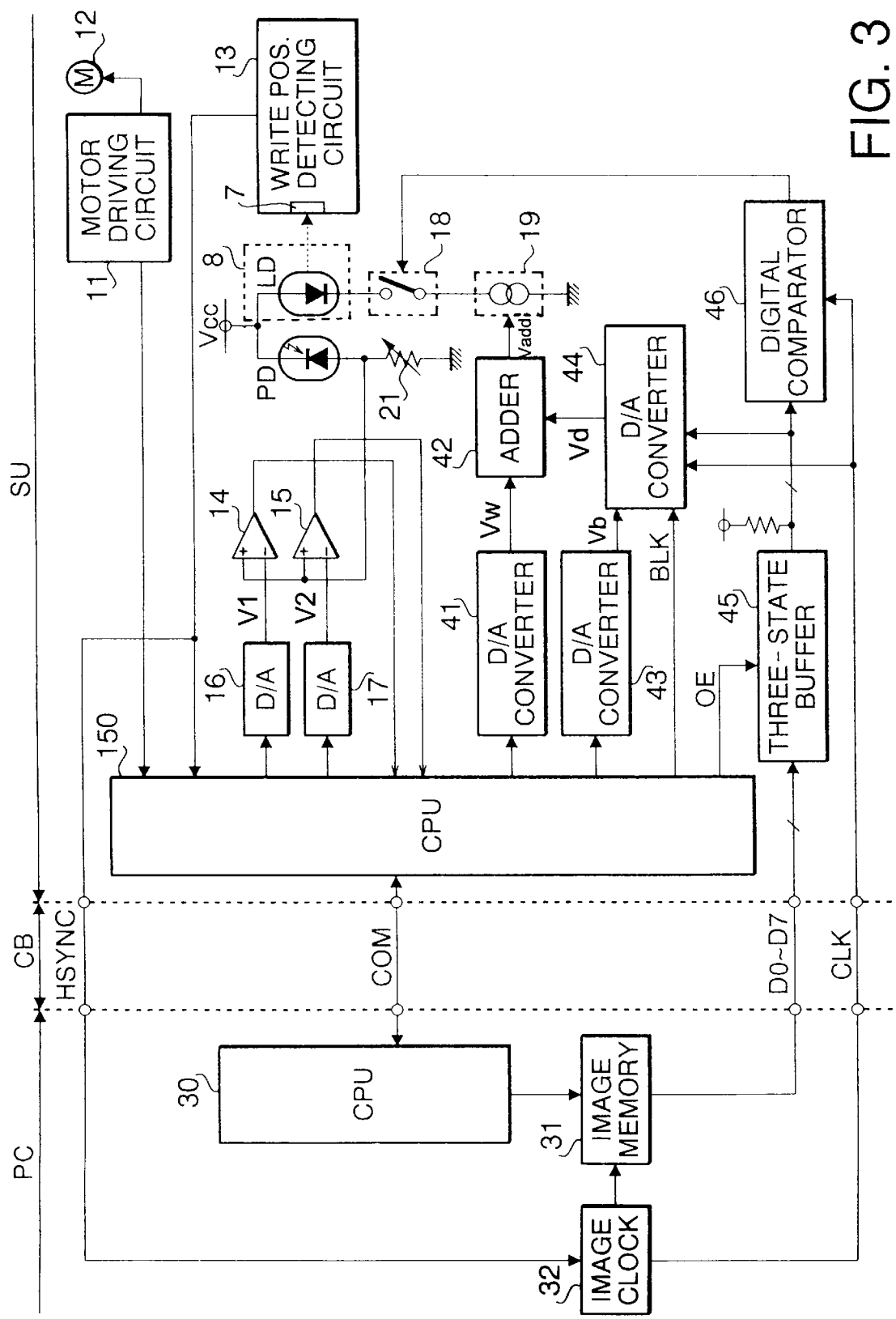
FIG. 3 is a block diagram of the laser scanning unit.

FIG. 3 is a block diagram of a laser beam printer employing the laser scanning unit SU. The laser beam printer has a printer controller PC, and the laser scanning unit SU, which are connected by cables CB.

The printer controller PC has a CPU 30, an image clock 32, and an image memory 31. The CPU 30 receives image data transmitted from an external device, such as a computer, develops the received image data into a bit map image and stores the bit map image data in the image memory 31. The image clock 32 outputs a data transfer clock CLK which is synchronously generated with the horizontal synchronous signal HSYNC. The bit map image data stored in the image memory 31 is synchronously read out by the CPU 30 with the transfer clock CLK on a line basis, and transferred to the laser scanning unit SU through a data line of the cables CB.

The laser beam printer is, as mentioned before, capable of producing a 256-step gradation image. Each line of the image consists of a plurality of pixels, and each pixel has information of 256-step gradation. To represent the 256-step gradation information, each pixel of the image has an eight-bit digital data D0 through D7. Accordingly, corresponding to each pixel of the image data, 8-bit image data is transmitted from the image memory 31 to the laser scanning unit SU. The image clock CLK is also transmitted from the image clock 32 to the laser scanning unit SU.

The polygonal mirror 3 is rotated by a motor 12. The motor 12 is controlled by the polygonal mirror control circuit 11 such that the polygonal mirror 3 rotates at a predetermined rotation speed.

As described before, when the light receiving sensor 7 receives the laser beam, the synchronous horizontal signal HSYNC which is referred to for controlling a writing start point of each line is generated by the write position detection circuit 13. The horizontal synchronous signal HSYNC is transmitted to the printer controller PU, and a CPU 150 of the laser scanning unit SU.

The semiconductor laser 8 is packaged, and in a package thereof the laser diode LD and the photo diode PD are provided to have a predetermined positional relationship. When the laser diode LD emits the laser beam towards the polygonal mirror 3, another laser beam (subsidiary beam) is emitted in the opposite direction. The photo diode PD is arranged to receive the subsidiary beam. Generally, the intensity of the subsidiary beam is proportional to the intensity of the main beam (the beam directed towards the polygonal mirror 3). Therefore, by detecting the intensity of the subsidiary beam, and adjusting the quantity of the intensity of the subsidiary beam, the intensity of the main beam can be adjusted.

In the embodiment, when the laser beam is incident to the photo diode PD, the electrical current corresponding to the intensity of the received laser beam is generated in the photo diode PD. Due to the electrical current flowing through a variable resistor 21, a voltage corresponding to the intensity of the laser beam received by the photo diode PD is generated across the variable resistor 21. The voltage generated across the variable resistor 21 is applied to positive terminals of comparators 14 and 15. To negative terminals of the comparators 14 and 15, output voltages of D/A (digital to analog) converters 16 and 17 are applied, respectively. Outputs of the comparators 14 and 15 are transmitted into the CPU 150.

To the D/A converters 16 and 17, a predetermined digital data is input. The analog-converted values of the predetermined digital data are applied to the comparator 14 and 15, respectively, as reference values.

Assume that the output voltages of the D/A converters 16 and 17 are a first voltage V1 and a second voltage V2, V1 being less than V2. Then, based on the output of the comparators 14 and 15, whether the voltage across the variable resistor 21 is: lower than the first voltage; between the first and second voltages; or greater than the second voltage can be determined.

Specifically, the predetermined digital data input to the D/A converters 16 and 17 are determined such that when the laser diode LD emits the laser beam having the white level intensity, the voltage across the variable resistor 21 coincides with the first voltage V1, and when the laser diode LD emits the laser beam having the black level intensity, the voltage across the variable resistor 21 coincides with the second voltage V2. The white level intensity and the black level intensity may vary depending on the sensitivity of the photoconductive drum 4. Accordingly, since the predetermined digital data is set to a default data, the digital data is changeable. Further, by varying the first and second voltages V1 and V2, the density of the image finally formed on the recording medium may be varied.

Utilizing the above, setting (adjusting) of the white and black levels are executed, which will be described in detail later. The reason why the resistor is connected to the photo diode PD is for canceling an intrinsic difference of the photo diode PD, and for adjusting the relationship between the voltage values of V1, V2 and the voltage across the resistor 21. That is, even if the intensity of the laser beam emitted by the laser diode LD is the same, due to the intrinsic difference of the characteristic of the photo diode PD, the voltage across the variable resistor 21 may vary if the resistance of the resistor 21 is fixed. In order to cancel such errors, or intrinsic difference, by varying the resistance of the variable resistor 21, it is adjusted that the voltage across the resistor 21 is always the same if the intensity of the laser beam is the same.

The laser diode LD is serially connected to a current source 19 through a switching element 18. When the switching element 18 is closed, the laser diode LD emits the laser diode, which intensity corresponds to the electrical current supplied by a current source 19. The current source 19 is a voltage-controlled current source. An output voltage of the adder 42 is input to the current source 19, and the current source 19 supplies the electrical current which corresponds to the applied voltage. To the adder 42, an output voltage Vw of the D/A converter 41 and an output voltage Vd of the D/A converter 44.

Figure 4:
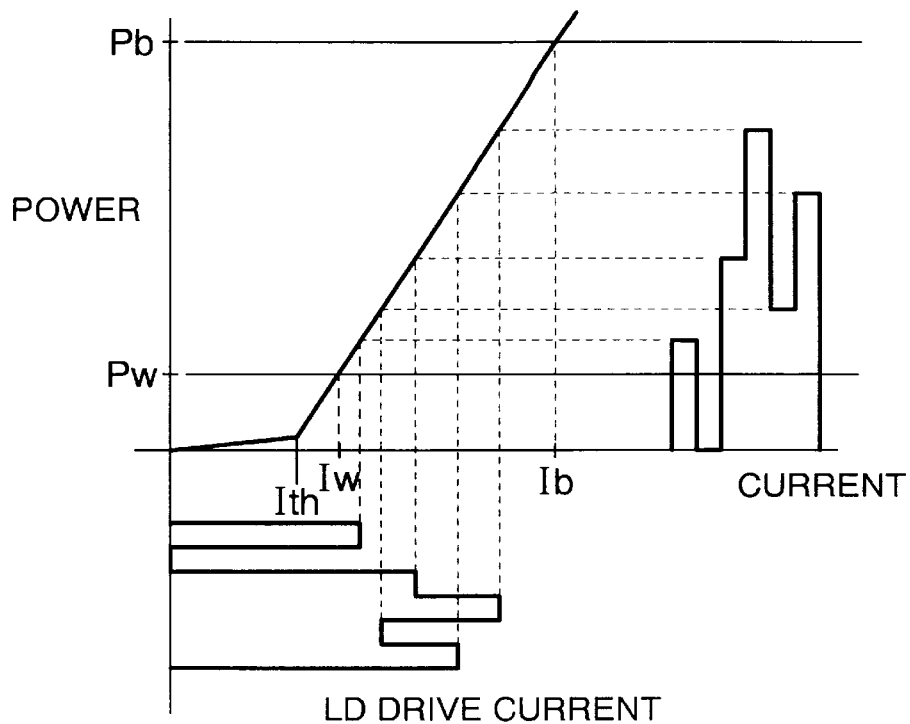
FIG. 4 is an I-C characteristic and a modulation characteristic of a laser diode according to the embodiment.
Figure 5:
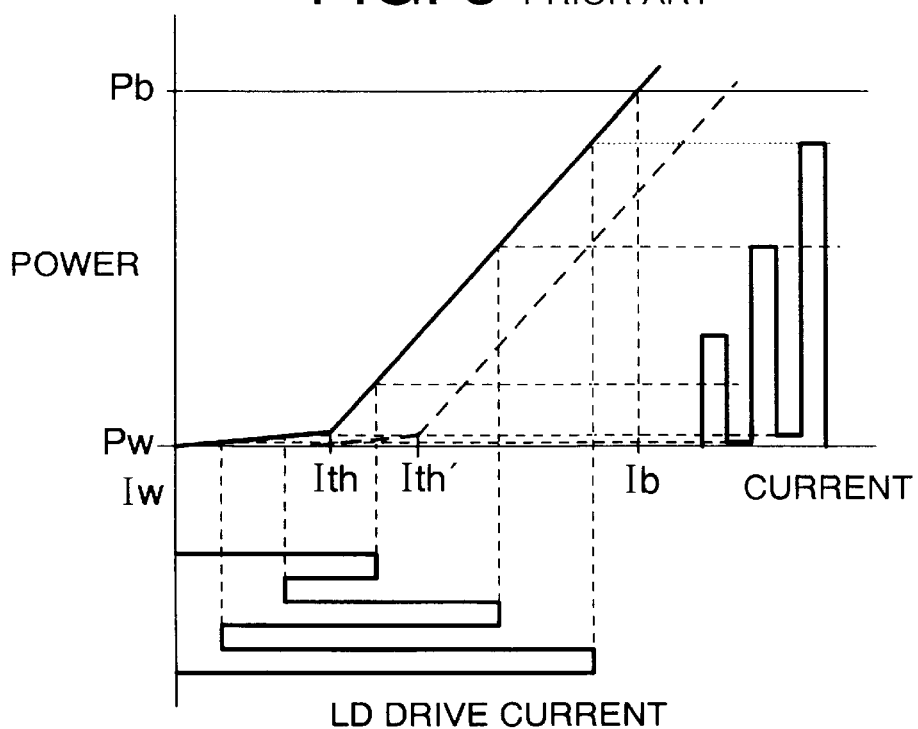
FIG. 5 is an I-C characteristic and a modulation characteristic of a laser diode according to the conventional art.

The Output voltage Vw of the D/A converter 41 is set such that, if only the output voltage Vw is applied to the current source 19, the electrical current flow through the laser diode LD will be greater than the threshold value Ith, and an image produced for use of the output laser beam will be recognized as a white image. A detailed description will be provided later. Only the output of the D/A converter 41 is applied to the current source 19, the electrical current available through the laser diode LD will be Iw, as shown in FIG. 4, and the intensity of the laser beam emitted by the laser diode LD is Pw (see FIG. 4). FIG. 4 shows an example of an I-C characteristic of a laser diode LD. As described above, the graph shows the intensity of the laser beam output by the laser diode corresponding to an electrical current available through the laser diode. In FIG. 4, further to the above, the input current (laser diode drive current) and the corresponding output intensity according to the shown I-C characteristic is also indicated.

The output voltage Vb of the D/A converter 43 is set such that, if the sum of the output voltage Vw of the D/A converter 41 and the output voltage Vb of the D/A converter 44 is applied to the current source 19, the electrical current flow through the laser diode LD will be Ib (shown in FIG. 4). The image to be produced when the laser diode emits the laser beam having the intensity of Ib will be recognized as a black image. A detailed description will be provided later.

To the intensity modulating D/A converter 44, output voltage Vb of the D/A converter 43, and the image data D0 through D7. The intensity modulating D/A converter 44 is a multiplication type converter which divides the input voltage input by the D/A converter 43 based on the input image data D0 through D7. Specifically, the output voltage Vd of the D/A converter 44 is expressed as:

Vd=DD×Vb/255 where, Vb is the output voltage of the D/A converter 43, DD is the decimal value of the image data D0 through D7 (0≦DD≦255).

The output voltage Vadd of the adder 42 is expressed as follows.

Vadd=Vw+Vd
=Vw+(DD×Vb/255)

When DD=0 (when each of the image data D0 through D7 is 0, i.e., a white image), Vadd=Vw. When voltage Vw is applied to the current source 19, electrical current Iw is supplied to the laser diode LD and the intensity of the laser beam is Pw. When DD=255 (when each of the image data D0 through D7 is 1, i.e., a black image), Vadd=Vw+Vb. When voltage Vadd (=Vw+Vb) is applied to the current source 19, electrical current Ib is supplied to the laser diode LD which emits the laser beam having the intensity Pb (see FIG. 4).

The image data supplied to the intensity modulating D/A converter 44 is transmitted from the printer controller PC through a three-state buffer 45. A three-state buffer 45 functions as a switch, and when a status of an input control signal OE is logical-HIGH, the three-state buffer 45 transmits the image data D0 through D7 to the intensity modulating D/A converter 44 and to the digital comparator 46 as is.

If the status of the input control signal OE is logical-low, the three-state buffer 45 becomes OFF condition (high-impedance condition), and therefore a pull-up voltage (logical-HIGH level) at the output side of the three-state buffer 45 is applied to the D/A converter 44 and to the digital comparator 46. In other words, all of the image data D0 through D7, which are input to the D/A converter 44 and the digital comparator 46, are set to logical-high when the input control signal OE is logical-low.

To the intensity modulating D/A converter 44, a blanking signal BLK is transmitted from the CPU 150 as a control signal. If a status of the blanking signal BLK is logical-high, the intensity modulating D/A converter 44 outputs values in accordance with the image data D0 through D7, which is transmitted from the three-state buffer 45, and the output voltage Vb of the black level setting D/A converter 43. When the blanking signal BLK is logical-low, the output voltage of the intensity modulating D/A converter 44 becomes zero (0).

A digital comparator 46 works synchronously with the data transfer clock CLK. The digital comparator 46 turns OFF the switch element 18 only when every bit of the image data D0 through D7 has a value zero.

To the positive terminals of the comparators 14 and 15, the voltage proportional to the electrical current available through the photo diode PD is applied, respectively. To the negative terminals of the comparators 14 and 15, the output voltages V1 and V2 of the D/A converters 16 and 17 are applied, respectively. The first voltage V1 is smaller than the second voltage V2. The comparators 14 and 15 compares the voltage proportional to the electrical current flowing through the photo diode PD with the first and the second voltages, respectively, and transmit the comparison result into the CPU 150. Namely, whether the voltage proportional to the electrical current available through the photo diode PD is lower than voltage V1, between voltages V1 and V2, or greater than voltage V2 is determined based on the output values of the comparators 14 and 15.

The quantities of voltages V1 and V2 are determined in accordance with data transmitted from the CPU 150 to the D/A converters 16 and 17, respectively. If voltage V1 is set to a voltage corresponding to the intensity Pw of the laser beam, and voltage V2 is set to a voltage corresponding to the intensity Pb of the laser beam, when the intensity of the laser diode LD becomes Pw and Pb can be detected based on the output of the comparators 14 and 15 when the APC is executed.

In the embodiment, the reference voltages applied to the negative terminals of the comparators 14 and 15 are the output voltages of the D/A converters 16 and 17, respectively. However, it is not limited to this configuration. If the voltages are known in advance, circuits for generating such voltages can be employed instead of the D/A converters 16 and 17.

In the embodiment, the reference voltages are made changeable. This configuration has an advantage such that the density of the entire image can be changed by changing the reference voltages. Further, the sensitivity of the photoconductive material can also be cancelled merely by changing the reference voltages.

The APC operation will be described. Note that a value of the variable resistor 21 has been adjusted, and the output voltages of the D/A converters 16 and 17 have also been determined.

If the scanning speed is relatively slow, the adjustment of the white level and the black level can be done within one scanning operation, after an image forming, and before the next horizontal synchronous signal HSYNC.

First, a laser beam is received by the light receiving sensor 7 of the write position detecting circuit 13 and the horizontal synchronous signal HSYNC is generated. Then, according to the horizontal synchronous signal HSYNC and synchronously with the transfer clock CLK, the image data D0 through D7 is sequentially transferred to the laser scanning unit SU from the image memory 31 of the printer controller PC. After the image forming operation in accordance with transferred image data has been finished, the APC is effected.

Assume that the APC for the white level intensity Pw is performed first.

In order to execute the APC, the control signal OE is set to logical-low to make the three-state buffer to have the high impedance. With this setting, regardless of the input image data D0 through D7, the three-state buffer 45 are ready to output data D0 through D7 each have value of H (logical-high). Then, the CPU 150 turns ON the switch element 18. The laser diode LD then emits the laser beam continuously. At this time, the blanking signal BLK input to the intensity modulating D/A converter 44 is set to logical-low state to make the output voltage of the intensity modulating D/A converter 44 to be zero. With this control, data 0 (zero) is input to the digital comparator 46.

Assume that some data is input to the white level setting D/A converter 41. The output voltages of the D/A converter 41 and the intensity modulating D/A converter 44 are input to the adder 42. However, since the output voltage of the intensity modulating D/A converter 44 is zero, the output voltage of the adder 42 is equal to the output voltage of the D/A converter 41, i.e., Vw.

Since the reference voltage of the comparator 14 corresponds to the white level intensity Pw of the laser beam, by increasing and decreasing the input data of the D/A converter 41, the point where the output of the comparator 14 switches from logical-high to logical-low, or from logical-low to logical-high. The point where the output of the comparator 14 switches is the point where the laser diode LD emits the laser beam having the white level intensity Pw.

If the output of the comparator 14 when the APC is started is logicla-low, the value of the input data of the D/A converter 41 is increased so that the intensity of the laser beam gradually increases. The input data to the D/A converter 41 when the output of the comparator 14 switches from logical-low to logical-high is considered to be the data for the white level intensity setting data.

If the output of the comparator 14 when the APC is started is logical-high, the value of the input data of the D/A converter 41 is decreased so that the intensity of the laser beam gradually decreases. In this case, the input data to the D/A converter 41 when the output of the comparator 14 switches from is logical-high to logical-low considered to be the data for white level intensity setting data.

When the white level setting data is determined as above, the value is fixed and then the APC for the black level intensity will be performed.

The APC for determining the black level intensity setting data is executed with maintaining the output data Vw of the D/A converter 41 as the value obtained in the APC for the white level intensity. Firstly, the control signal OE to be transmitted to the three state buffer 45 is set to logical-low to set the three-state buffer 45 into the high impedance status. With this setting, all the bit data to be input to the D/A converter 44 and to the digital comparator 46 becomes 1 (i.e., the decimal value of the input data becomes 255).

As described above, the intensity modulating D/A converter 44 outputs the multiplication of the output voltage of the D/A converter 43 and the input data value/255. Since the input data value is 255, the intensity modulating D/a converter 44 outputs the voltage of the D/A converter 43. The adder 42 therefore outputs Vb+Vw. In the APC for the black level intensity, the voltage Vb is adjusted such that the intensity of the laser beam coincides with the value Pb.

The reference voltage input to the comparator 15 (i.e., the output voltage of the D/A converter 17) corresponds to the voltage across the variable resistor 21 when the laser diode emits the laser beam having the intensity of Pb. Therefore, if a point where the output of the comparator 15 switches from logical-high to logical-low, or logical-low to logical-high is detected, the point can be considered to be the point where the laser diode Ld output the laser beam having the black level intensity Pb. Similar to the APC for the white level intensity, by increasing/decreasing the input data of the D/A converter 43, the intensity of the laser beam can be varied. If the input data of the D/A converter 43 which make the intensity of the laser beam emitted by the laser diode LD to be Pb is detected, the APC for the black level intensity Pb is finished. The data to be input to the D/A converter 43 thus detected is fixed.

The image forming operation will be described.

After the APC is completed, the laser diode LD is controlled to emit modulated laser beam in accordance with the voltages Vw and Vb, and the image data D0 through D7.

The CPU 150 set the control signal OE input to the three-state buffer 45 to be logical-high in order to allow the data transmission from the image memory 31 to the three-state buffer 31. When the intensity modulating D/A converter 44 receives the image data D0 through D7 by way of the three-state buffer 45, voltage Vd expressed as follows is output.

$Vd = Vb \times DD/255$ where, DD is a decimal value represented by the image data D0 through D7.

The adder 42 adds the output voltage Vd of the intensity modulating D/A converter 44 and output voltage Vw of the D/A converter 41, and outputs the voltage Vadd.

$Vadd = Vw + (Vb \times DD/255)$

The output voltage Vadd of the adder 42 is input to the current source 19. Therefore, according to the value of the input data D0 through D7, the intensity of the laser beam varies within a range defined between a minimum value Pw and a maximum value Pb. However, according to the above described control, when the value represented by the data D0 through D7 is zero, the laser beam has the intensity of Pw. This might not produce a white image in an accurate sense because Pw is not zero. To avoid this problem, when all the bits of the input image data D0 through D7 are zero, a control signal is sent from the digital comparator 46 to the switching element 18 to turn OFF the switching element 18. Thus, when the value represented by the image data D0 through D7 is zero, the laser diode LD is controlled not to emit the laser beam, and a perfect white level is achieved.

The image forming operation and the APC operation is executed as described above, if the image data has a value greater than zero, the electrical current to be available through the laser diode LD varies within the range between Iw and Ib which are greater than the threshold value Ith, and intensity modulating with use of the electrical current lower than the threshold value Ith is avoid. Therefore, the gradation image can be produced accurately. Further, if image data represents a white image, the laser diode LD is controlled not to emit the laser beam. Therefore, the white image can also be produced accurately without a fog effect. Furthermore, even if the sensitivity of the photoconductive drum is changed due to a replacement thereof or due to the deterioration with age, by varying the input data of the D/A converters 16 and 17, the change of the sensitivity of the photoconductive drum can easily be cancelled.

Since the APC operation is executed at each scanning, the change of the characteristic of the laser diode LD due to the change of the operational emvironment does not affect the density of the image.

Figure 6:
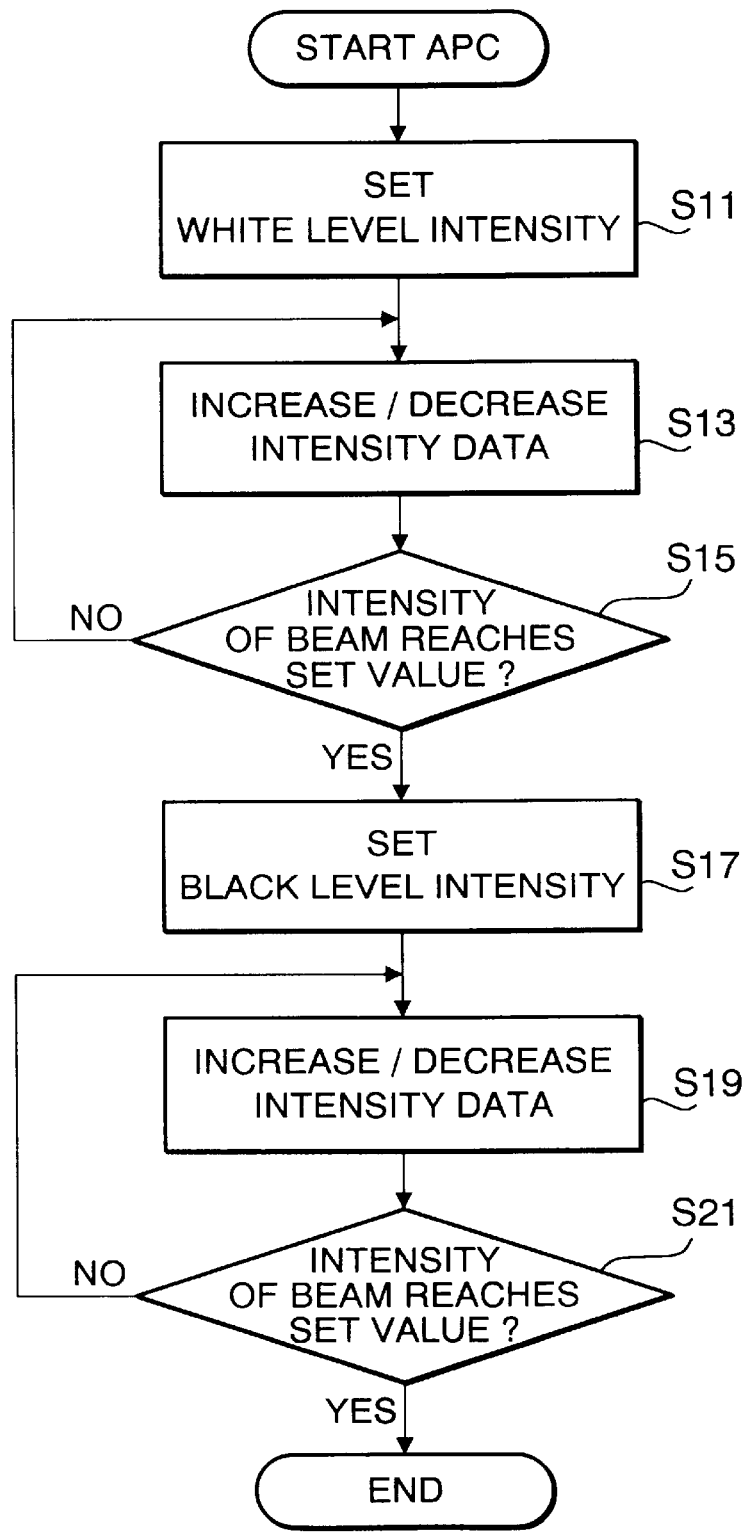
FIG. 6 is a flowchart illustrating a first example of an automatic intensity compensation procedure.

FIG. 6 shows a flowchart illustrating a first embodiment of the APC operation. The procedure shown in FIG. 6 illustrates a case where the scanning speed is relatively slow and the APC for both black level intensity and white level intensity can be adjusted within one scanning period.

As shown in FIG. 2, within one scanning period (i.e., between two successive horizontal synchronous signals), the image forming operation is performed first, and then within the remaining period, the APC operation is performed.

In FIG. 6, at S11, in order to start the APC operation for the white level intensity, the control signal OE is set to logical-low, the switch 18 is closed, and the blanking signal BLK is set to logical-low. At the initial stage, the value of the input data to the D/A converter 41 is set to a default value, and the data used in the previous APC operation is used as the input data to the D/A converter 41 in the succeeding APC operations. At S13, the input data to the D/A converter 41 is increased or decreased. Specifically, if the comparator 14 outputs logical-high level signal, the input data is decreased, and if the comparator 14 outputs logical-low level signal, the input data is increased. Then, at S15, the CPU 150 determines whether the voltage across the variable resistor 21 reaches voltage V1 by detecting when the output signal of the comparator 14 has changed from logical-high to logical-low, or logical-low to logical-high. If the output signal of the comparator 14 has not been changed, the CPU 150 determines that the voltage across the variable resistor 21 does not reach the voltage V1, i.e., the intensity of the laser beam emitted by the laser diode LD does not have the white level intensity (S15:NO). Then step S13 is executed again and the voltage applied to the current source 19 is changed at S13, and the intensity is examined again at S15.

If the intensity of the laser beam reaches the white level, step S15 determines YES, and then the black level intensity is adjusted.

At S17, in order to start the APC operation for the black level intensity, the control signal OE is maintained to be logical-low, the switch 18 is closed, and the blanking signal BLK is set to be logical-high. Similar to the case where the APC for the white level intensity is executed, the value of the input data to the D/A converter 43 is set to a default value when the APC for the black level intensity is executed, and the data used in the previous APC operation for the black level intensity is used as the input data to the D/A converter 43 in the succeeding APC operations for the black level intensity. At S19, the input data to the D/A converter 43 is increased or decreased. Specifically, if the comparator 15 outputs logical-high level signal, the input data is decreased, and if the comparator 15 outputs L level signal, the input data is increased. Then, at S21, the CPU 150 determines whether the voltage across the variable resistor 21 reaches voltage V2 by detecting when the output signal of the comparator 15 has changed from logical-high to logical-low, or logical-low to logical-high. If the output signal of the comparator 15 has not been changed, the CPU 150 determines that the voltage across the variable resistor 21 does not reach the voltage V2, i.e., the intensity of the laser beam emitted by the laser diode LD does not have the black level intensity Pb (S21:NO). Then steps S19 and S21 is executed until the intensity of the laser beam emitted by the laser diode LD reaches the black level intensity Pb.

The above described APC operations both for the white level intensity and the black level intensity are executed at every scanning operation.

Figure 7:
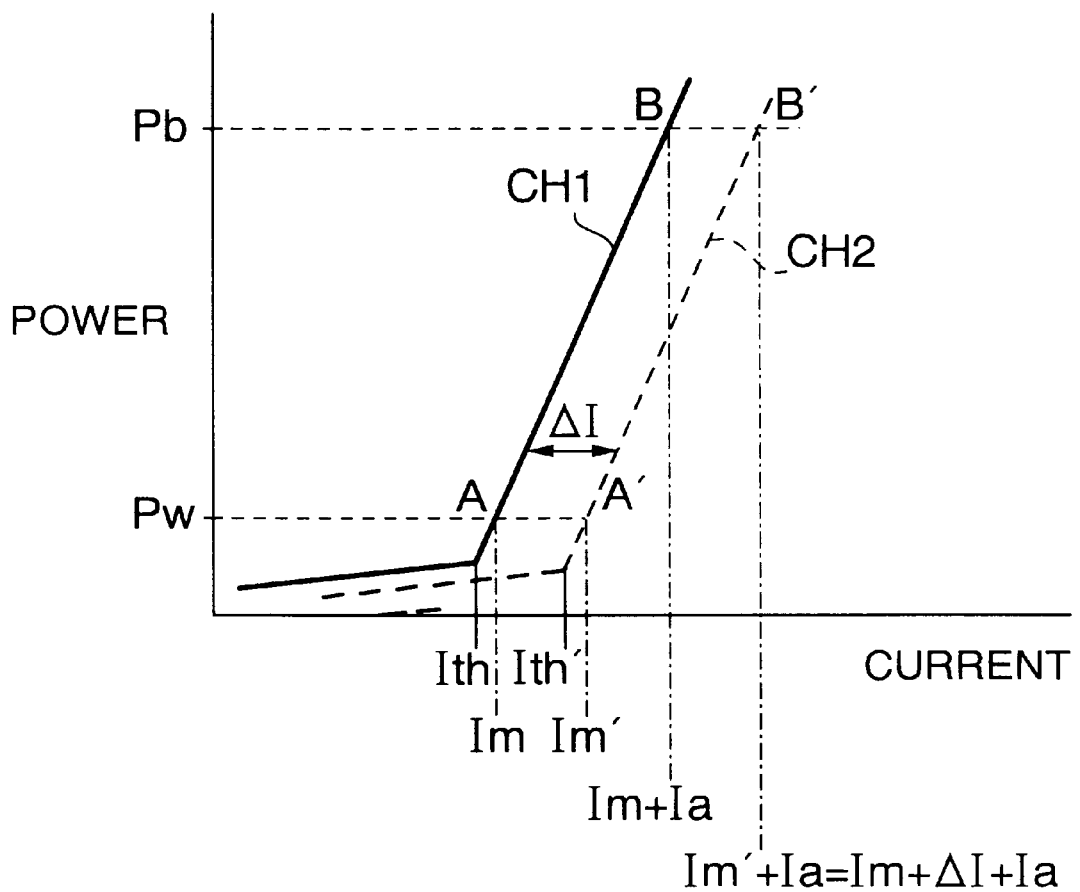
FIG. 7 is a graph showing the change of the I-C characteristic of the laser diode.

FIG. 7 shows the change of the I-C characteristic of the laser diode LD due to the change of the ambient temperature. In FIG. 7, a characteristic CH1 (indicated by a solid line) is a characteristic when the ambient temperature is relatively low, and a characteristic CH2 (indicated by a broken line) is a characteristic when the ambient temperature is relatively high. As described before, the characteristic CH2 is obtained by shifting the characteristic in a right-hand direction in FIG. 7 by the amount of $\Delta I$. As shown in FIG. 7, since the graph for the characteristic CH2 is shifted rightward with respect to the characteristic CH1, the threshold current value Ith for the characteristic CH1 is also increased, in the characteristic CH2, to a value Ith'. The inclination (which is called as a differential efficiency) of the graphs are considered to be substantially the same.

According to the characteristic CH1, when the electrical current Im is available in the laser diode LD, the intensity of the laser beam is the minimum intensity (white level intensity) Pw, which is indicated as a point A. When the electrical current Im+$\alpha$ is available in the laser diode LD, the intensity of the laser beam is the maximum intensity (the black level intensity) Pb which is indicated as a point B.

In order to have the similar intensity of the laser beam in accordance with the characteristic CH2, the electrical current corresponding to the points A' to B' on the graph should be made flow through the laser diode LD.

The electrical current corresponding to point A' and B' are Im' and Im'+I$\alpha$, which are expressed as follows.

Im'=Im+$\Delta I$

Im'+I$\alpha$=Im+$\Delta I$+I$\alpha$

As described above, when the ambient temperature changes, $\Delta I$ is to be taken into account. According to the embodiment, a sum of the currents Im+$\Delta I$ corresponds to the voltage Vw, and the electrical current I$\alpha$ corresponds to the voltage Vb. The current value available in the laser diode LD corresponds to the output voltage Vadd of the adder 42 which is expressed as follows.

Vadd=Vw+(Vb$\times$DD/255)

Therefore, the change of the current value due to the change of the ambient temperature is compensated only by changing the voltage Vw which corresponds to the white level intensity.

Figure 8:
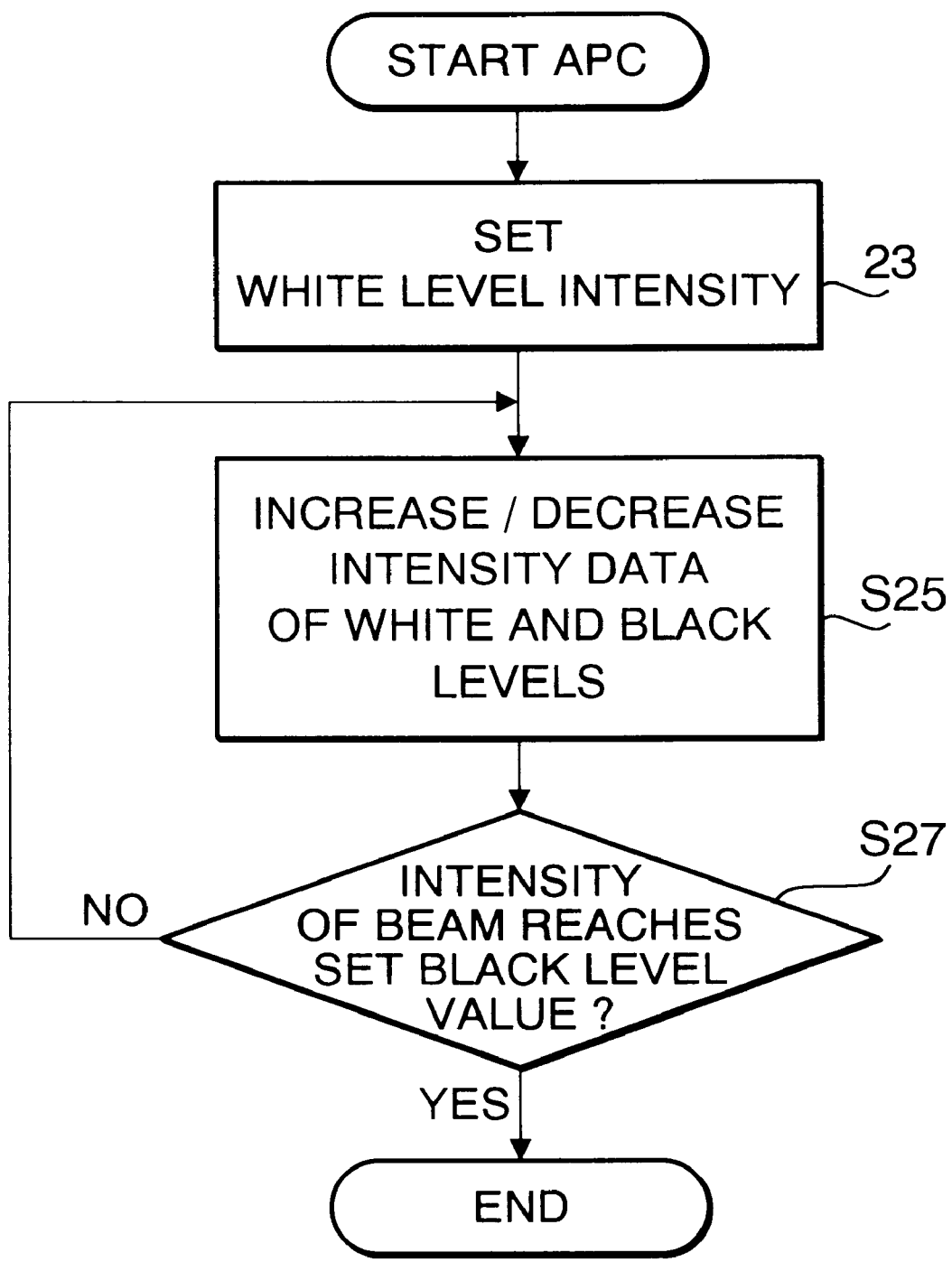
FIG. 8 is a flowchart illustrating a second example of the automatic intensity compensation procedure.

FIG. 8 is a flowchart illustrating a second embodiment of the APC operation to be executed in the laser scanning unit SU.

At S23, a predetermined value is set as a data value to be input to the D/A converter 41. The input data to be input to the D/A converter 43 has a value which is a sum of the value of the input data to the D/A converter 41+a predetermined voltage value. The predetermined voltage value corresponds to the difference of the current values between the points A and B, or A' and B' of FIG. 7. In the second embodiment, with maintaining the above relationship, the input data to the D/A converter 41 is changed, and the output of the comparator 15 is monitored (S25). Specifically, the control signal OE and the blanking signal BLK are set to logical-low. Then, depending on the output value of the comparator 15, the data value input to the D/A converter 41 is increased or decreased (S25). For example, if the output of the comparator 15 is L when the APC is started, the data value input to the D/A converter 41 is increased, and detects when the output data of the comparator 15 changes from logicla-low to logical-high.

When the output value of the comparator 15 switches between logical-low and logical-high, the data input to the D/A converter 41 is determined to be the white level setting data.

In the second embodiment, the voltage value vb of the D/A converter 43 is fixed and only the voltage value Vw output from the D/A converter 41 is adjusted such that the black level intensity Pb is obtained. Therefore, only one APC operation, both the white level intensity and the black level intensity can be adjusted simultaneously.

Figure 9:
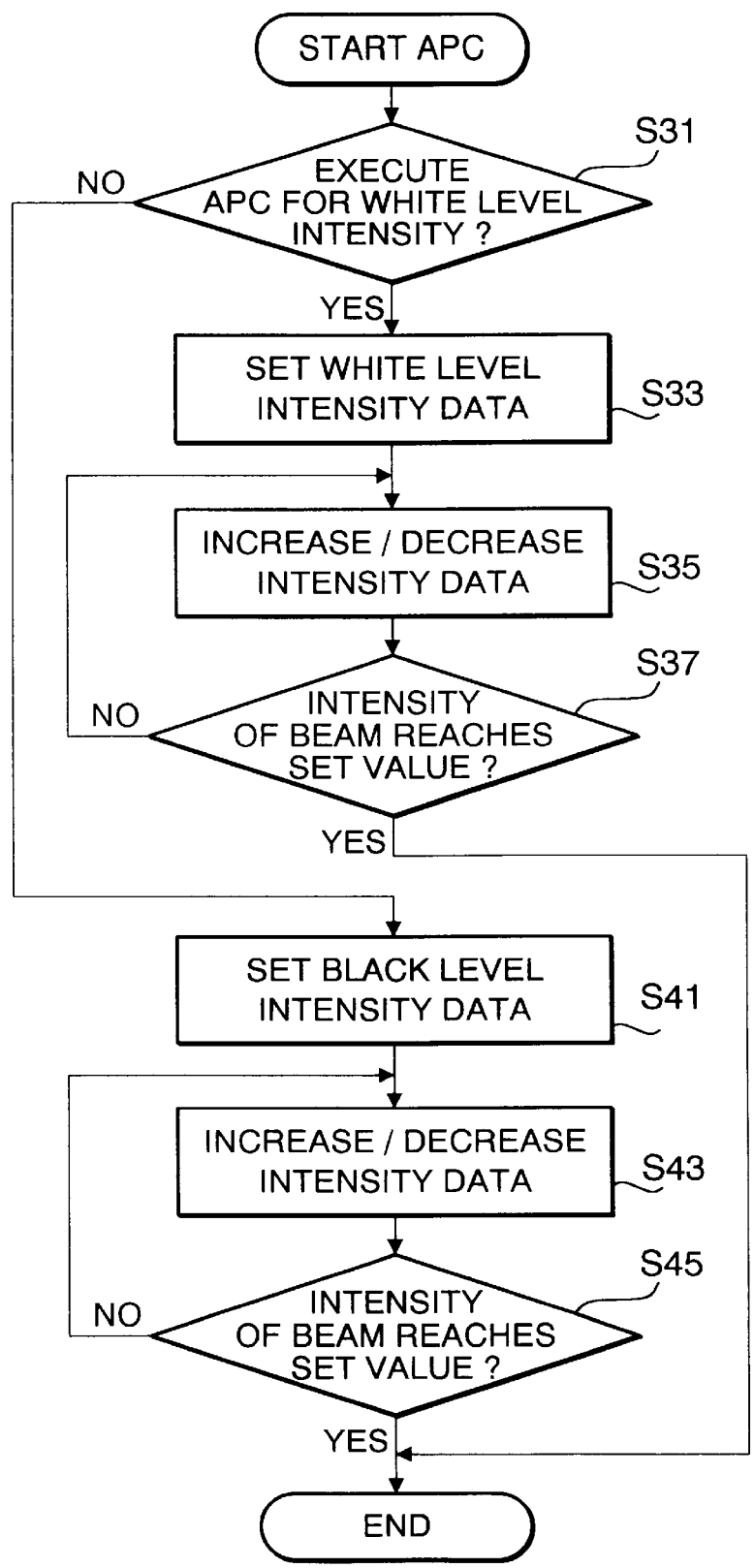
FIG. 9 is a flowchart illustrating a third example of the automatic intensity compensation procedure.

FIG. 9 shows a flowchart illustrating the APC operation according to a third embodiment of the present invention.

In the third embodiment, the scanning speed is relatively fast, and only one of the white level intensity or the black level intensity is adjusted within one scanning operation. In other words, the APC operations for black level intensity and the white level intensity are executed alternately.

At step S31, the APC operation for which level intensity is to be executed is determined based on the APC operation of which of black or white level intensity was previously executed. When the previous APC operation is for the black level intensity, the APC operation for the white level operation is executed (S31:YES). In such a case, the blanking signal BLK is set to logical-low and the APC operation for the white level intensity is executed at S33 through S37 which is similar to the operation at S11 through S15 in FIG. 6. If the APC operation for the black level intensity is to be executed (S31:No), then the blanking signal BLK is set to logical-high and the APC operation for the black level intensity is executed at S41 through S45 which is similar to the operation at S27 through S21 of FIG. 6.

FIGS. 10A through 10F are timing charts showing data communication between the printer controller PC and the laser scanning unit SU through the communication line COM.

When the laser beam printer 100 is turned ON (FIG. 10A), the main CPU 30 of the printer controller PC transmits an initiation data R1 to the CPU 150 of the laser scanning unit SU (FIG. 10B). The CPU 150 executes an operation C1 (see FIG. 10F) which is a data receiving operation when the initiation data is transmitted from the CPU 30. In the operation C1, the polygonal mirror 3 is started to rotate, and laser diode is turned ON. When the laser beam printer 100 is ready to execute a printing job (when the rotation of the polygonal mirror is stabilized, and the laser beam is stably emitted by the laser diode), the CPU 150 transmits a ready signal T1 (see FIG. 10C) after the data transmitting operation C2 (FIG. 10F).

The main CPU 30 transmits an operation checking data RC (see FIG. 10B) to the laser scanning unit SU during printing jobs. The CPU 150 of the laser scanning unit SU switches its operation from the main operation M to the data receiving operation C1 when the operation checking data RC is transmitted (FIGS. 10B and 10F), and examines the current operation. If the current operation is normally executed, the CPU 150 transmits the data TC indicating that the operation is normally executed in the data transmitting operation C2 (FIGS. 10C and 10F), and if an operation error has been occurred, the CPU 150 transmits an NG data in the data transmitting operation C2.

The operation checking data RC includes data related to the change of the sensitivity of the photoconductive drum 4 as well as other data necessary for examining the operation. The CPU 150 changes the input data to the D/A converters 16 and 17 in accordance with the data related to the change of the sensitivity of the photoconductive drum. Accordingly, the reference voltages applied to the comparators 14 and 15 are changed to meet the sensitivity of the photoconductive drum 4. The data related to the change of the sensitivity of the photoconductive drum 4 is included in the operation checking data RC only when the change of the input data to the D/A converters 16 and 17 becomes necessary. In the NG data, data related to the part of the laser scanning unit SU which does not operate correctly is included.

The data communication between the printer controller PC and the laser scanning unit SU is mainly executed during the printing operation when the load to the CPU 150 is relatively small. Areas indicated as CM in FIG. 10D are periods where the data communication can be done, and areas PR are periods where the printing is executed.

FIG. 10D shows a laser ON/OFF signal. The signal is an active-low signal, and when /VIDEO is "L", the laser diode LD is turned ON. The APC operation is executed during the periods AP (see FIGS. 10D, and 10F). in this timing chart, the scanning speed is relatively high, and therefore the period AP is relatively short. Accordingly, the APC operation as illustrated in FIG. 9 is employed, and the data values to be supplied to the D/A converters 41 and 43 are alternately determined.

During each period AP, the APC operation has a higher priority than the data communication operation. That is, while the APC operation is executed, the data communication operation cannot be executed. Further, if the data communication operation and the APC operation are to start simultaneously, the APC operation is executed firstly, and after the completion of the APC operation, the data communication is executed.

In the embodiments described above, in response to the operation checking signal R1 transmitted by the main CPU 30, the CPU 150 transmits data related to the operating condition of the laser scanning unit SU to the main CPU 30. Therefore, for example, if the laser diode LD is not turned ON, whether it occurs because the laser diode LD is deteriorated or because the /VIDEO signal is "H" is transmitted to the main CPU 30.

According to the embodiments described above, the white level intensity corresponding to the minimum intensity of the laser beam and the black level intensity corresponding to the maximum intensity of the laser beam are set, and the range defined by the white level intensity and the black level intensity is divided by the number of gradation steps. Further, by changing the white level intensity and the black level intensity, the intensity range defined by the white and black level intensities can be shifted. Therefore, accurate gradation image can be obtained regardless of the I-C characteristic of the laser diode, and regardless of the change of sensitivity of the photoconductive drum (i.e., the surface to be scanned).

Further, according to the third embodiment, even if the scanning speed is relatively high, the black and white level intensities can be adjusted accurately without slowing down the scanning speed.

Furthermore, if the image data represents a white pixel, the laser diode is controlled not to emit the laser beam.

Accordingly, a so-called fog phenomenon on the latent image would not occur, and the qualified image can be obtained.

Still further, since the intensity of the laser beam can be compensated in accordance with the change of the sensitivity of the photoconductive drum, the produced image usually has the desired gradation.

The present disclosure relates to subject matter contained in Japanese Patent Application No. HEI 7-246694, filed on Aug. 31, 1995, which is expressly incorporated herein by reference in its entirety.

What is claimed is:

1. A laser scanning unit, employed in an imaging apparatus, for scanning a predetermined scanning area of a surface to be scanned with a laser beam, comprising:

a laser diode that emits said laser beam;

a driver that drives said laser diode to emit said laser beam with an intensity corresponding to one of a plurality of predetermined gradation steps within an intensity range defined between a first intensity, being a minimum intensity used to form an image, and a second intensity, being a maximum intensity used to form an image, in accordance with image data;

a photodiode that measures and outputs a signal corresponding to said intensity of said laser beam;

a comparing system that compares an output of said photodiode with reference values corresponding to said first intensity and said second intensity;

a reference value setting system that sets and changes said reference values; and a controller that shifts said intensity range by controlling said reference value setting system to change said reference values.

2. The laser scanning unit according to claim 1, wherein said controller shifts said intensity range in accordance with a sensitivity of said surface to be scanned.

3. The laser scanning unit according to claim 2, wherein said imaging apparatus and said controller are configured to communicate with each other, and wherein data related to said sensitivity of said surface to be scanned is transmitted from said imaging apparatus to said controller.

4. The laser scanning unit according to claim 1, wherein said laser diode controller controls said laser diode to not emit said laser beam when said image data represents a zero value.

5. The laser scanning unit according to claim 1, wherein said controller divides said intensity range into a predetermined number of intensity steps between the first intensity and second intensity, and wherein said controller controls said driver to modulate the intensity of the beam emitted by the laser diode in accordance with image data to correspond to one of the intensity steps for each pixel.

6. A laser scanning unit, employed in an imaging apparatus, for scanning a predetermined scanning area of a surface to be scanned with a laser beam, comprising:

a laser diode that emits said laser beam;

a driver that drives said laser diode to emit said laser beam with an intensity corresponding to one of a plurality of predetermined gradation steps within an intensity range defined between a first intensity, being a minimum intensity used to form an image, and a second intensity, being a maximum intensity used to form an image, in accordance with an image data;

a first adjusting system that is actuated to adjust said first intensity to become a first predetermined intensity;

a second adjusting system that is actuated to adjust said second intensity to become a second predetermined intensity; and a controller that shifts at least one of said first predetermined intensity and said second predetermined intensity.

7. The laser scanning unit according to claim 6, wherein said controller independently changes each of said first predetermined intensity and said second predetermined intensity.

8. The laser scanning unit according to claim 6, wherein said controller shifts said at least one of said first predetermined intensity and said second predetermined intensity in accordance with a sensitivity of said surface to be scanned.

9. The laser scanning unit according to claim 6, wherein said first adjusting system comprises:

a detector that detects said intensity of said laser beam;

a comparator that compares said intensity of said laser beam with said first predetermined intensity, wherein said intensity of said laser beam is changed in accordance with a comparison result of said comparator.

10. The laser scanning unit according to claim 6, wherein said second adjusting system comprises:

a detector that detects said intensity of said laser beam; and a comparator that compares said intensity of said laser beam with said second predetermined intensity, wherein said intensity of said laser beam is changed in accordance with a comparison result of said comparator.

11. The laser scanning unit according to claim 6, wherein said first and second adjusting systems are actuated when said laser beam does not scan said predetermined scanning area of said surface to be scanned.

12. The laser scanning unit according to claim 6, wherein only one of said first adjusting system and said second adjusting system is actuated at each scanning operation.

13. The laser scanning unit according to claim 12, wherein said first adjusting system and said second adjusting system are alternately actuated for successive scanning operations.

14. The laser scanning unit according to claim 6, wherein said first adjusting system and said second adjusting system are successively actuated during each scanning operation.

15. The laser scanning unit according to claim 6, wherein said laser diode controller controls said laser diode to not emit said laser beam when said image data represents zero value.

16. The laser scanning unit according to claim 6, wherein said first adjusting system is also actuated when said second adjusting system is actuated.

17. The laser scanning unit according to claim 6, wherein said controller divides said intensity range into a predetermined number of intensity steps between the first intensity and second intensity, and wherein said controller controls said driver to modulate the intensity of the beam emitted by the laser diode is modulated in accordance with image data to correspond to one of the intensity steps for each pixel.

* * * * *